US008661393B2

(12) United States Patent
Boone et al.

(10) Patent No.: US 8,661,393 B2
(45) Date of Patent: Feb. 25, 2014

(54) METHOD FOR ANALYZING PLACEMENT CONTEXT SENSITIVITY OF STANDARD CELLS

(75) Inventors: Robert E. Boone, Austin, TX (US); Puneet Sharma, Cedar Park, TX (US); Matthew A. Thompson, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/536,694

(22) Filed: Jun. 28, 2012

(65) Prior Publication Data

US 2014/0007029 A1 Jan. 2, 2014

(51) Int. Cl.
*G06F 17/50* (2006.01)

(52) U.S. Cl.
USPC ............ 716/122; 716/118; 716/119; 716/123

(58) Field of Classification Search
USPC .................................. 716/118–119, 122–123
See application file for complete search history.

(56) References Cited

U.S. PATENT DOCUMENTS

| | | | |
|---|---|---|---|
| 5,847,965 A | 12/1998 | Chen | |
| 6,215,896 B1 | 4/2001 | Greig et al. | |
| 7,434,197 B1 | 10/2008 | Dolainsky et al. | |
| 7,594,216 B2 * | 9/2009 | Kotani et al. | 716/50 |
| 7,685,558 B2 | 3/2010 | Lai et al. | |
| 7,707,526 B2 | 4/2010 | Su et al. | |
| 7,725,845 B1 | 5/2010 | White et al. | |
| 7,725,861 B2 | 5/2010 | Cheng et al. | |
| 7,739,627 B2 * | 6/2010 | Chew et al. | 716/132 |
| 7,805,692 B2 | 9/2010 | Jeng | |
| 7,873,929 B2 * | 1/2011 | Kahng et al. | 716/118 |
| 7,979,812 B2 | 7/2011 | Jung et al. | |
| 8,037,428 B2 | 10/2011 | Tong et al. | |
| 8,103,995 B2 | 1/2012 | Wang | |
| 8,214,787 B1 * | 7/2012 | Reis | 716/134 |
| 2004/0168143 A1 * | 8/2004 | Kishibe | 716/10 |
| 2007/0083842 A1 * | 4/2007 | Namba et al. | 716/17 |
| 2007/0264731 A1 | 11/2007 | Jeng | |
| 2007/0266352 A1 | 11/2007 | Cheng et al. | |
| 2007/0266362 A1 | 11/2007 | Lai et al. | |
| 2008/0066041 A1 * | 3/2008 | Kahng et al. | 716/10 |
| 2008/0178142 A1 | 7/2008 | Takada | |
| 2008/0253644 A1 | 10/2008 | Xu et al. | |
| 2008/0295046 A1 | 11/2008 | Su et al. | |

(Continued)

OTHER PUBLICATIONS

Gupta, Puneet, Kahng, Andrew B., Muddu, Swamy V., Nakagawa, Sam; Modeling Edge Placement Error Distribution in Standard Cell Library, Proc. of SPIE vol. 6165, 61560S, 2006.

*Primary Examiner* — Naum Levin
(74) *Attorney, Agent, or Firm* — Jackson Walker L.L.P.

(57) ABSTRACT

A disclosed method for evaluating placement context sensitivity in the design of an integrated circuit includes accessing a standard cell library comprising a database of standard cells and determining generating boundary data for each of the standard cells. The boundary data for a standard cell indicates the layout of features located within boundary regions of the standard cell. The method includes merging or consolidating boundary data for any two standard cells if their boundary data is the same to determine a canonical or minimal set of boundary regions. The disclosed method further includes enumerating and evaluating all combinations of pairs of the canonical boundary regions and, responsive to identifying a proximity-based sensitivity or exception, modifying, notating, or otherwise remediating the applicable one or more standard cells that correspond to the boundary region combination that raised the exception.

20 Claims, 4 Drawing Sheets

(56) References Cited

U.S. PATENT DOCUMENTS

| | | |
|---|---|---|
| 2009/0268958 A1 | 10/2009 | Kwang et al. |
| 2009/0271749 A1 | 10/2009 | Tang et al. |
| 2009/0300561 A1 | 12/2009 | Tong et al. |
| 2010/0131915 A1 | 5/2010 | Hirabayashi |
| 2010/0185998 A1 | 7/2010 | Wang |
| 2010/0199255 A1 | 8/2010 | Jung et al. |
| 2011/0004855 A1 | 1/2011 | Choi |
| 2011/0084312 A1* | 4/2011 | Quandt et al. ............... 257/202 |
| 2012/0144349 A1* | 6/2012 | Dai et al. ..................... 716/52 |

* cited by examiner

METHOD FOR ANALYZING PLACEMENT CONTEXT SENSITIVITY OF STANDARD CELLS

BACKGROUND

Field of Disclosure

Verifying the physical layout of an integrated circuit generally includes checking a proposed layout for proximity-based sensitivities including, as examples, lithography hotspot sensitivities, lithography induced timing variability, and colorability for double-patterning lithography. In a standard cell library containing a large number of standard cells, performing a proximity analysis with respect to the local placement context of each possible pair of adjacent cells requires extensive verification resources. For example, checking just the left and right side contexts for a standard cell library containing just 1,000 standard cells requires 1,000,000 pairing combinations. For a standard cell library containing 10,000 cells, the number rises to 100,000,000 pairing combinations, while still ignoring such issues as nonlinear pitch effects for certain illumination schemes and router-induced layout variation (e.g., addition of pin metal).

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
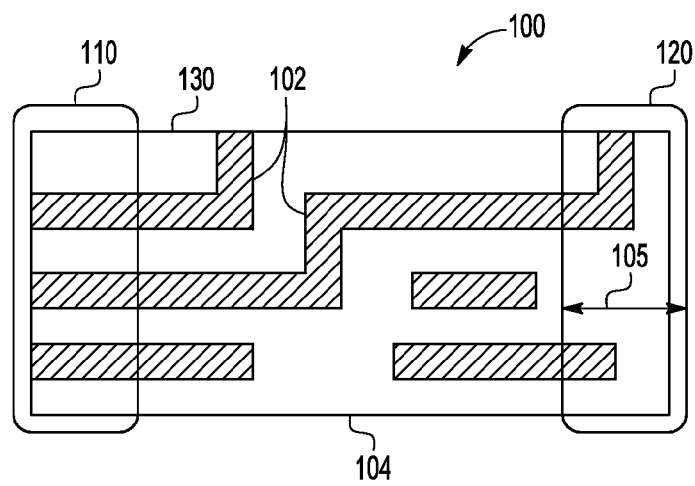
FIG. 1 depicts a physical layout of one layer of a first standard cell from a standard cell library.

Disclosed subject matter addresses the problem of analyzing proximity-based sensitivity in the context of two neighboring standard cells by excluding portions of each standard cell from the analysis and by reducing the number of combinations of standards cells requiring analysis. By focusing, for example, on boundary regions of standard cells and, more specifically, combinations of adjacent boundary regions between adjacent instances of standard cells, the disclosed subject matter beneficially reduces the number of boundary region combinations that must be analyzed by identifying and eliminating redundancy in the sets of boundary regions. Context sensitivity analysis can then be performed for each pair of boundary regions in the reduced sets of boundary regions, sometimes referred to herein as the canonical sets of boundary regions, to determine context-based placement sensitivity for the entire standard cell library.

An exception raised while performing proximity analysis of a particular pair of boundary regions may be traced back to all standard cells associated with the boundary region that caused the exception. Each of those standard cells may then be remediated by, for example, modifying the layout of the standard cell to address the sensitivity that arose during the analysis or by notating the combination of boundary regions that produced the exception and constraining subsequent placements of the standard cells to avoid the combination. Because boundary regions are relatively small and contain relatively few elements, there is a reasonable likelihood that two different standard cells may have the same boundary region. Disclosed techniques can identify two or more cells that have the same boundary regions and reduce the set of boundary regions requiring consideration by employing a single boundary region for all of the cells having the same boundary region, thereby identifying a reduced set or canonical set of boundary regions and beneficially reducing the verification resources required to verify the boundary region possibilities for the entire cell library.

One aspect of the subject matter described below pertains to a disclosed method of evaluating placement context sensitivity in the verification of a proposed physical layout for an integrated circuit. The method may include accessing a standard cell library that includes a plurality of standard cells. A standard cell, for purposes of this disclosure, may be described as a data structure that indicates the physical layout of the applicable cell. The method includes determining a first boundary library that includes a plurality of first boundary data structures. A boundary data structure indicates a layout of the elements of a standard cell located within a boundary region of the standard cell.

The first boundary library may be initialized by including the first boundary data structures corresponding to each of the standard cells. If two or more first boundary data structures in the first boundary library match one another, the method merges the matching structures into a common first boundary data structure and reduces the size of the first reduced boundary library. The first reduced boundary library is then used to check local placement context for combinations of standard cells in the standard cell library. Local placement context for each combination of a first boundary data structure in the first reduced boundary library and a second boundary data structure in the second reduced boundary library is performed.

The handling of an identified exception corresponding to a specific combination of first and second boundary data structures may be handled by tracing the boundary data structures from the combination that raised the exception back to the corresponding standard cells. If a boundary data structure raising an exception is a common boundary data structure, tracing the boundary data structure back includes tracing the boundary data structure back to two or more standard cells.

Standard cells identified during the proximity analysis may then be remediated. Remediating a standard cell may include modifying a layout of the effected standard cell to address the exception raised. If no suitable or feasible layout modification can be determined, remediating a standard cell may include annotating the standard cell to indicate a placement constraint associated with the effected standard cell. In this case, the placement constraint may prevent adjacent placement of the applicable pair of standard cells with the first boundary region of the first standard cell adjacent to the second boundary region of the second standard cell, i.e., prevent the same relative and adjacent placement of the standard cell pair as the placement that raised the exception.

The method may include, in addition to determining a reduced boundary library for a first boundary region, determining a second reduced boundary library for a second boundary region of the standard cells. If the set of second boundary data structures includes any two or more data structures that match, matching boundary data structures may be merged into a common second boundary data structure to produce a second reduced boundary library. When the proximity analysis is performed, boundary data structures from the first reduced library may then be checked against boundary data structures from the second reduced library.

In some disclosed embodiments, the first boundary region defines a portion of a standard cell located within a predetermined distance of a right boundary of the standard cell and the second boundary region defines a portion of the standard cell located within the predetermined distance of a left boundary. In other embodiments, the first boundary region may define a top portion of the standard cell and the second boundary region may define a bottom portion of the standard cell.

Regardless of which boundary a boundary region is associated with, the dimension or size of the boundary region may be predetermined, perhaps based on an optical radius of an imaging system associated with the standard cell library or on another limitation or specification of an apparatus or system used in the fabrication process.

Another aspect of disclosed subject matter describes a data processing system suitable for use in the design of an integrated circuit. In this aspect, the system includes a processor having access to a storage medium. The storage medium stores executable program instructions for evaluating placement context sensitivity. When the processor executes the program instructions, the system performs a method that includes accessing a standard cell library comprising a plurality of standard cells and determining a first canonical set of boundary regions associated with a first boundary of the standard cells and further determining a second canonical set of boundary regions associated with a second boundary of the standard cells. The first boundary and second boundary may represent adjoining boundaries of a pair of adjacently located standard cells. A canonical set of boundary regions may represent the set of unique boundary regions in a standard cell library, i.e., the set of boundary regions obtained by merging all common boundary regions into a single corresponding boundary region.

Proximity analysis is performed to identify any placement context sensitivity inherently contained in the standard cell library by performing proximity analysis on each boundary region combination. The proximity analysis performed may include analyzing boundary region combinations for photolithography hotspots, photolithography induced timing variability, and colorability for double-patterning photolithography. A boundary region combination includes a boundary region from the first canonical set and a boundary region from the second canonical set. Standard cells associated with the specific boundary region combination may be identified and remediated in response to detecting, during the proximity analysis, an exception associated with a specific boundary region combination. Remediating the standard cells may include modifying a layout of one or more of all identified standard cells or annotating standard cells identified to define placement constraints for the identified standard cells identified. Again, as described above with respect to methods disclosed herein, placement constraints prevent placement of the standard cells identified adjacent to one another in the same manner as the boundary region combination that produced the exception.

Another aspect of disclosed subject matter encompasses software instructions stored on a computer readable medium. In this aspect, a non-transitory, computer readable medium storing program instructions, executable by a processor, for performing placement context analysis of combinations of adjacent standard cells, includes program instructions which, when executed by the processor, perform the method described above.

Turning now to the drawings, FIG. 1 depicts selected elements of an embodiment of a standard cell 100 from a standard cell library. The embodiment of standard cell 100 depicted in FIG. 1 represents a layout of a plurality of physical elements or features 102 within field 104 of standard cell 100. As depicted in FIG. 1, field 104 of standard cell 100 is substantially rectangular although, in other embodiments, standard cells may be square, rectangular, or other suitable shapes.

The features 102 of standard cell 100, as will be appreciated by those of skill in the field of integrated circuit design, represent physical structures or regions that are deposited, etched, implanted, grown, or otherwise processed at a particular stage in the fabrication of a semiconductor device or other structure. A standard cell may encompass a set of features defined by a set of photo masks and the standard cell 100 depicted in FIG. 1 may represent the features 102 of the corresponding standard cell that are processed in conjunction with a specific one of the photo masks. In these embodiments, each feature 102 corresponds to a portion of a standard cell formed during the applicable stage in the fabrication process. As an example, the standard cell 100 depicted in FIG. 1 may represent polycrystalline silicon features, including transistor gate electrodes, of a standard cell for a latch that includes two transistors. In this example, the features 102 of standard cell 100 correspond to features of the transistors formed during a polysilicon stage of the fabrication process where the polysilicon state may include a deposition step, with or without a subsequent doping or implant step, a photolithography sequence using a positive or negative resist, and an etch step. In this example, features 102 of standard cell 100 represent portions of a deposited polysilicon film that remain after the lithography and etch sequences are performed.

FIG. 1 emphasizes selected regions of standard cell 100 for purposes of performing proximity-based context sensitivity analysis. More specifically, the embodiment of standard cell 100 depicted in FIG. 1 includes a first boundary region, referred to herein as left boundary region 110, a second boundary region, referred to herein as right boundary region 120, and a central region 130 lying between left boundary region 110 and right boundary region 120. The size and location of boundary regions 110 and 120 relative to the field 104 of standard cell 100 may be determined by one or more boundary region parameters including a boundary region radius 105.

The values of the particular boundary region parameters used may reflect limitations of equipment or processes used to fabricate a device. For example, the boundary region radius 105 may represent the optical radius of an imaging system. In this example, the boundary region radius defines the portions of a standard cell that may influence proximity-based sensitivities, i.e., context sensitivities that arise when two standard cells are placed adjacent to or otherwise in close proximity to one another.

Defining boundary regions for standard cells beneficially reduces the layout information that a layout checking program or algorithm must consider. Although the examples depicted herein emphasize left and right boundary regions, the number of boundary regions that a program analyzes may be more than two. Similarly, although the examples described herein illustrate the use of left and right boundary regions, other implementations may use additional or different boundary regions. For example, other implementations may include top and bottom boundary regions and the proximity-based analysis may consider top and bottom boundary region combinations instead of or in addition to the left and right boundary region combinations described below.

Figure 2:
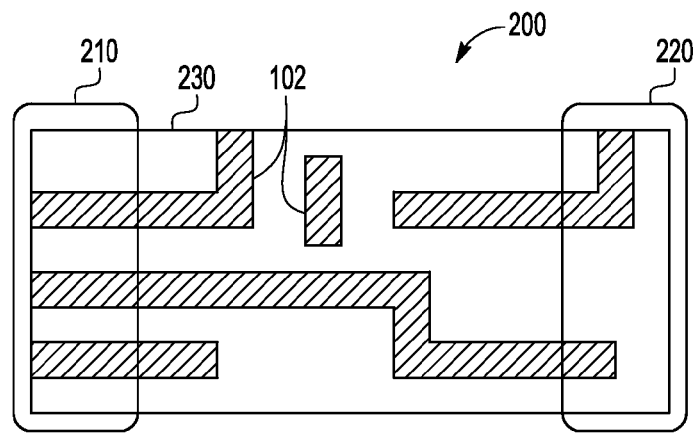
FIG. 2 depicts a second standard cell that is different than the first standard cell, but has boundary regions that are the same as the boundary regions of the first standard cell of FIG. 1.

Referring now to FIG. 2, a second standard cell 200 is depicted. Standard cell 200 as depicted in FIG. 2 includes a left boundary region 210, a right boundary region 220, and a central region 230 between boundary regions 210 and 220. Like standard cell 100 depicted in FIG. 1, standard cell 200 of FIG. 2 includes a number of features 102 corresponding to structures or regions of the device to be formed. First standard cell 100 and second standard cell 200 correspond to the same stage in the fabrication process. If, for example, standard cell 100 of FIG. 1 represents the polysilicon features of a first standard cell, then standard cell 200 of FIG. 2 represents the polysilicon features of a second standard cell.

Although standard cell 100 as depicted in FIG. 1 and standard cell 200 as depicted in FIG. 2 include different features 102, it will be observed that left boundary region 210 of standard cell 200 is the same or substantially similar to left boundary region 110 of standard cell 100 depicted in FIG. 1. In other words, the pattern of features 102 within left boundary region 210 of standard cell 200 and left boundary region 110 of standard cell 100 is the same or substantially the same. Similarly, the right boundary region 220 of standard cell 200 of FIG. 2 and the right boundary region 120 of standard cell 100 in FIG. 1 are also the same or substantially similar. When the like-type boundary regions, e.g., the left boundary regions or the right boundary regions, of two or more standard cells in a standard cell library share a common set of features, the boundary regions that share the same layout may be consolidated into a single boundary region, referred to herein as a canonical boundary region, for purposes of proximity-based analysis as described herein. It should be noted that, although standard cell 100 and standard cell 200 share two pairs of boundary regions that are the same, consolidation of boundary regions can occur whenever two standard cells have a like-type boundary region that are the same. Thus, even if right boundary regions 120 and 220 of FIG. 1 and FIG. 2 respectively did not share the same layout of features 102, the left boundary regions 110 and 210 can be consolidated into one canonical left side boundary region as described herein.

Figure 3:
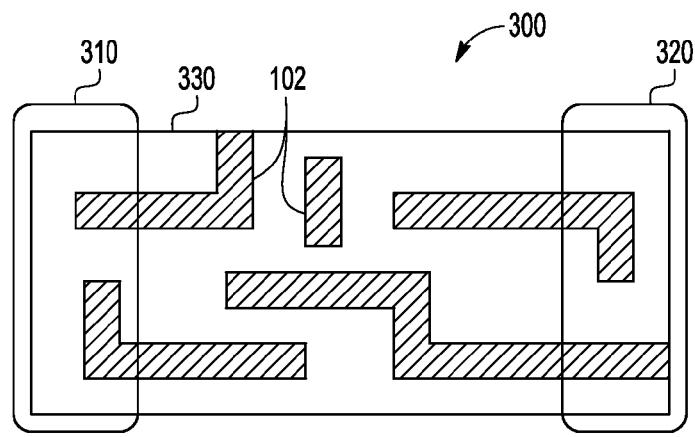
FIG. 3 depicts a third standard cell having boundary regions that differ from the boundary regions of the standard cells of FIG. 1 and FIG. 2.

Referring now to FIG. 3, a third standard cell 300 is depicted as including a left boundary region 310, a right boundary region 320, and a central region 330 located between left boundary region 310 and right boundary region 320. It will be observed that the boundary regions of standard cell 300 as depicted in FIG. 3 do not share a common layout with the boundary regions of standard cells 100 and 200. Specifically, left boundary region 310 has a different layout of features 102 than left boundary regions 110 and 210 while right boundary region 320 has a different layout of features 102 than right boundary regions 120 and 220. It should be noted that consolidation of boundary regions for purposes of proximity-based placement analysis is determined based on like-type boundary regions. If, for example, left boundary region 310 was the same as right boundary region 220, no consolidation of the two boundary regions occurs because left boundary region 310 and right boundary region 220 are not like-type boundary regions.

Figure 4:
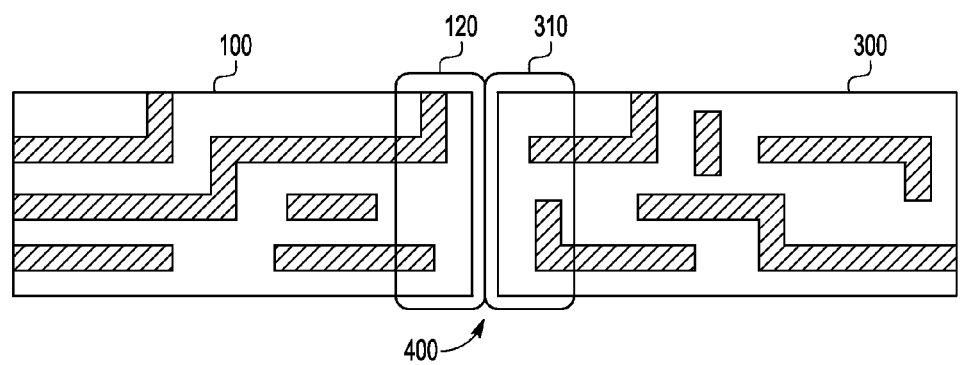
FIG. 4 depicts a placement of instances of the first and third standard cells adjacent to one another.

Referring now to FIG. 4, a depiction of a representative side-by-side placement of two standard cells is presented. Specifically, FIG. 4 depicts the placement of an instance of standard cell 100 laterally adjacent to an instance of standard cell 300 with standard cell 100 to the left of standard cell 300. In this particular placement of standard cells, the right boundary region 120 of standard cell 100 contacts or is in close proximity to left boundary region 310 of standard cell 300. Again, as suggested previously, the depicted examples emphasize left and right boundary regions and therefore are applicable to laterally adjacent standard cells and, more specifically, laterally adjacent boundary regions of two standard cells. Embodiments that consider, for example, top and bottom boundary regions would be illustrated with respect to longitudinally adjacent boundary regions.

The combination of left boundary region 120 and right boundary region 310 represents an instance of a boundary region combination identified in FIG. 4 by reference numeral 400. Boundary region combination 400 represents one of a potentially large number of boundary region combinations that are possible in any standard cell library. Without any form of boundary region consolidation or reduction as described herein, the set of possible boundary region combinations may be too large to analyze in a cost effective manner.

Figure 5:
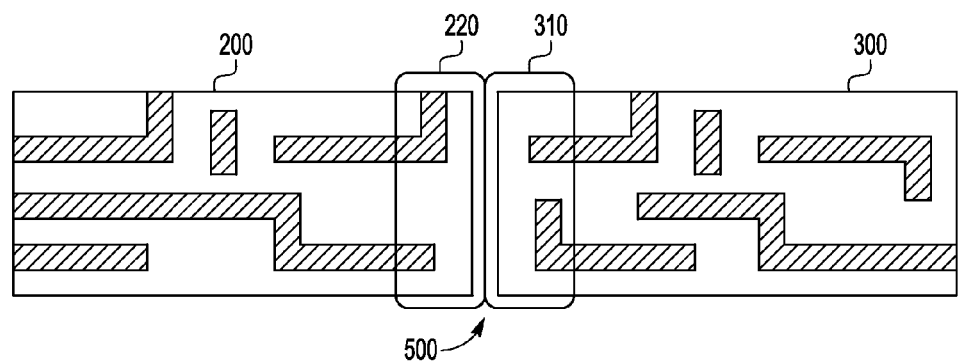
FIG. 5 depicts a placement of instances of the second and third standard cells adjacent to one another.

Referring to FIG. 5, a second placement of standard cells adjacent to one another is depicted. In the embodiment depicted in FIG. 5, a boundary region combination 500 includes a right side boundary region 220 of standard cell 200 and left side boundary region 310 of standard cell 300. Although the pair of adjacent standard cells depicted in FIG. 4 is different than the pair of adjacent standard cells depicted in FIG. 5, it will be observed that boundary region combination 400 and boundary region 500 share the same layout of features.

One aspect of the subject matter disclosed herein includes a recognition that the boundary region combinations depicted in FIG. 4 and FIG. 5 are the same and that, for purposes of proximity-based analysis, the boundary region combinations may be treated as the same. This recognition enables a simplification of the database by reducing the number of boundary region combinations. Thus, as depicted in FIG. 4 and FIG. 5, the identification of a common boundary region combination enables the disclosed subject matter, whether implemented as a method, a software program, or a machine or other apparatus, to reduce the database associated with this design by decreasing the number of boundary region combinations. A conventional implementation of proximity-based analysis is required to consider the combination of cells in FIG. 4 distinctly from the combination of cells depicted in FIG. 5.

Moreover, by restricting the proximity-based analysis to the boundary regions, the likelihood of encountering boundary regions that share a common feature layout is increased. In other words, the chances that any two like-sized regions of two different standard cells share a common set of features increases as the size of the like-sized regions decreases. Depending on the value of boundary region radius 105, there may be substantial commonality among the set of boundary regions for a given standard cell library.

As described in greater detail below, one aspect of disclosed subject matter recognizes that, for purposes of proximity-based placement sensitivity analysis, the combination of standard cells depicted in FIG. 4 is substantially the same as the combination of cells depicted in FIG. 5. Thus, the disclosed subject matter beneficially takes advantage of the commonality between two combinations of standard cells that result in boundary region combinations that are the same or substantially the same. Because, for example, boundary region combination 400 depicted in FIG. 4 is the same or substantially the same as the boundary region combination 500 depicted in FIG. 5, proximity-based analysis performed on boundary region combination 400 is applicable to boundary region combination 500 without further analysis, i.e., performing a proximity-based analysis of boundary region 500 is not required if a proximity-based analysis is performed on boundary region combination 400 and vice versa.

Figure 6:
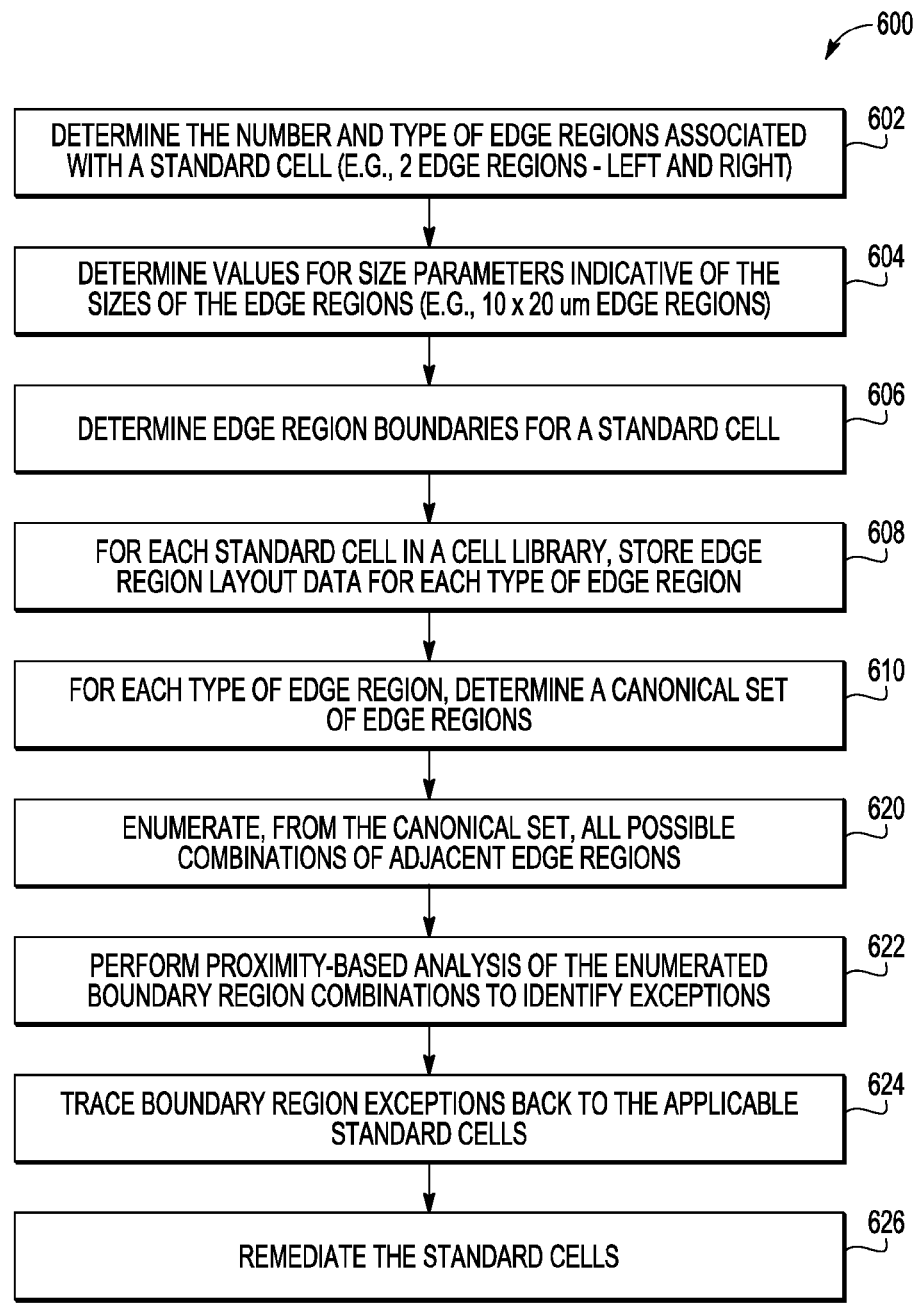
FIG. 6 is a flow diagram of selected elements of a method for performing proximity-based analysis for a standard cell library.

Referring now to FIG. 6, selected elements of one embodiment of a method 600 for performing proximity-based analysis includes a determination (block 602) of the number and type of boundary regions associated with standard cells in a standard cell library. The operation represented by block 602 may determine the number of boundary regions for each standard cell, and the location of those boundary regions within the standard cell. Presumably, these parameters will be the same for each standard cell in the library such that, for example, block 602 might determine that two boundary regions will be considered for each standard cell and that those two boundary regions are located at the left and right edges of the respective standard cell.

The depicted embodiment of method 600 includes a determination (block 604) of values for size parameters that indicate the sizes of the boundary regions. Block 604 emphasizes that, for each implementation of the described method, it is important to identify the size of a boundary region based on an optical effect or other type of phenomenon that has a physical manifestation during fabrication such as the optical radius 105 referred to previously. In some embodiments, the size of the boundary regions is substantially smaller than the size of the cell as a whole. In these embodiments, the relatively small area covered by a boundary region beneficially simplifies proximity analysis by eliminating a large percentage of the standard cell's features from consideration.

The method 600 depicted in FIG. 6 further includes an operation 606 in which the boundary region size parameters from operation 604 are used in conjunction with standard cell information to define the precise boundaries of the boundary regions for each standard cell. After the boundary regions are defined in block 606, method 600 as shown includes storing (block 608) boundary region layout data for each defined boundary region. The boundary region layout data, as its name suggests, refers to data indicating the features within a boundary region.

After boundary region layout data has been stored as described with respect to operation 608, the depicted embodiment of method 600 includes determining (block 610) a canonical set of boundary regions. As described above, the determination of a canonical set of boundary regions may include determining unique instances of boundary regions found within the standard cells of a standard cell library. Block 610 may include, for example, comparing the boundary region layout data for each of the boundary regions, identifying any matches that occur, and consolidating all matching boundary regions into a corresponding canonical boundary region. The set of all such canonical boundary regions, together with any boundary regions that were unique and for which no canonical boundary region could be determined, comprises the canonical set of boundary regions.

After determining the canonical set of boundary regions in operation 610, the depicted embodiment of method 600 includes enumerating (block 620) all possible combinations of adjacent boundary regions within the canonical set. If, as a simple example, the canonical set of boundary regions includes five left side boundary regions and six right side boundary regions, operation 620 would enumerate a set of 30 boundary region combinations.

Once all of the combinations of adjacent boundary regions have been enumerated in block 620, method 600 as depicted in FIG. 6 further includes performing proximity-based analysis (block 622) of the enumerated boundary region combinations to identify any exceptions or other failures that occurred. As suggested above, proximity-based analysis may include checking a boundary region combination for lithography hotspots, lithography induced timing variability, and colorability for double patterning lithography.

If the proximity-based analysis performed in block 622 identifies any boundary region combinations that raise proximity-based exceptions, one or both of the boundary regions in the boundary region combination may be traced (block 624) back to the applicable standard cells. If, for example, a boundary region combination includes a left boundary region that is common to a set of ten cells in the standard cell library, and an exception was raised during a proximity-based analysis of the boundary region combination, block 624 is employed to identify the 10 standard cells associated with the applicable boundary region.

After the standard cells corresponding to a boundary region associated with an exception raised during proximity-based analysis are identified in block 624, the depicted embodiment of method 600 includes remediating (block 626) the applicable standard cells. Remediation of standard cells may include modifying the standard cell's layout to address the applicable exception. Remediation of a standard cell may also include notating the applicable standard cells with information describing boundary region combinations that might result in a proximity-based placement sensitivity. The notations might serve to constrain the placement of standard cells. A route and place algorithm might, for example, have access to any such annotations such that after a cell is annotated appropriately, the algorithm will not route or place the combination of standard cells that raised the exception adjacent to one another.

Figure 7:
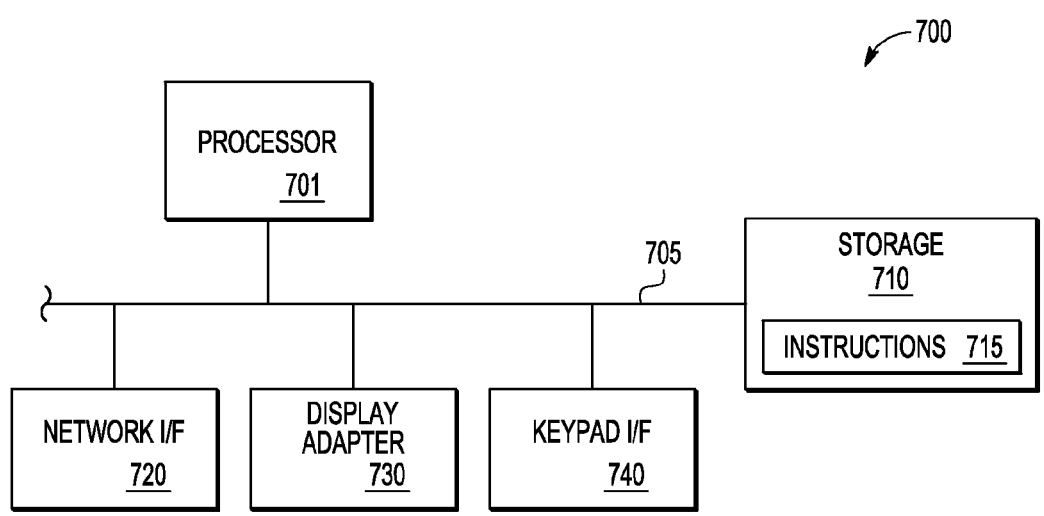
FIG. 7 depicts a data processing apparatus suitable for carrying out the data processing method of FIG. 6.

Referring now to FIG. 7, selected elements of one embodiment of a data processing system 700 are shown. The data processing system 700 as depicted emphasizes and supports implementations of the invention as a method, an apparatus, and a computer readable medium. In the embodiment depicted in FIG. 7, data processing system 700 includes a processor 701 having access to a storage medium 710 via a bus 705. Processor 701 may be a general-purpose microprocessor, an application-specific integrated circuit, a microcontroller, etc. The storage medium 710 may include volatile and nonvolatile storage media. Storage medium 710 as depicted in FIG. 7 is shown as including a set of instructions 715. The instructions 715 represent processor executable instructions that, when executed, may perform a method such as method 600 depicted and described with respect to FIG. 6.

The embodiment of data processing system 700 depicted in FIG. 7 further includes I/O resources including a keypad or other type of input-output device 740, a display adapter 730 in combination with a display device not depicted in FIG. 7, and a network interface card 720 that may be employed in a wireline or wireless network medium to permit data processing system 700 to participate in a network.

Although the invention is described herein with reference to specific embodiments, various modifications and changes can be made without departing from the scope of the present invention as set forth in the claims below. For example, although left and right boundary regions were emphasized in the drawings, other boundary regions may be considered. Similarly, although the depicted examples referred to the polysilicon features of a device, the described methodology is applicable to any process layer. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all of the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit design method, comprising:
    accessing a standard cell library including a plurality of standard cells, wherein a standard cell comprises a data structure indicative of a layout of a plurality of physical elements defining the standard cell;
    determining, from the standard cell library, a first boundary library including a first boundary structure corresponding to each of the plurality of standard cells, wherein the first boundary structure indicates a layout of a first boundary region of the corresponding standard cell;
    responsive to identifying multiple first boundary structures in the first boundary library sharing a common layout, merging, by a data processing system, the multiple first boundary structures into a common boundary structure to produce a reduced first boundary library;
    checking, by the data processing system, local placement context for the standard cell library by checking local placement context for boundary structure pairs comprising a first boundary structure from the reduced first boundary library and a second boundary structure from a second boundary library corresponding to a second boundary region of the standard cells; and
    responsive to an exception raised by the local placement context checking of a first boundary structure pair:
        identifying standard cell pairs, including a first standard cell and a second standard cell, that include the first boundary structure pair; and
        resolving, by the data processing system, the exception by performing an operation selected from:
            annotating the standard cell pairs that have the first boundary structure pair to constrain a subsequent standard cell placement resulting in a standard cell pair possessing the first boundary structure pair; and
            remediating the first boundary structure pair, wherein the remediating includes:
                generating a remediated first boundary structure pair including a remediated first boundary structure; and
                replacing instances of the first boundary structure in the first standard cell of standard cell pairs possessing the first boundary structure with the remediated first boundary structure.

2. The method of claim 1, wherein identifying the standard cell pairs includes, tracing the exception back to standard cells whose first boundary structures were merged into the common boundary structure.

3. The method of claim 1, wherein a layout of the remediated first boundary structure differs from a layout of the first boundary structure.

4. The method of claim 3, wherein a function of the remediated first boundary structure matches a function of the first boundary structure.

5. The method of claim 1, further comprising:
    determining a number of edge regions upon which to perform the checking of local placement context; and
    determining a size of each of the edge regions.

6. The method of claim 1, further comprising:
    determining, from the standard cell library, a second boundary library corresponding to the second boundary region of each of the standard cells; and
    responsive to identifying matching second boundary structures in the second boundary library, merging the matching second boundary structures into a common second boundary structure to produce a reduced second boundary library.

7. The method of claim 1, wherein the first boundary region corresponds to a portion of the standard cell located within a predetermined distance of a right standard cell boundary and the second boundary region corresponds to a portion of the standard cell located within the predetermined distance of a left standard cell boundary.

8. The method of claim 7, wherein the constraining prevents placement of standard cells possessing the first boundary structure adjacent and to the left of standard cells possessing the second boundary structure.

9. The method of claim 1, wherein the first boundary region corresponds to a portion of the standard cell located within a predetermined distance of a top standard cell boundary and the second boundary region corresponds to a portion of the standard cell located within the predetermined distance of a bottom standard cell boundary.

10. The method of claim 9, wherein the predetermined distance is based on an optical radius of an imaging system associated within the standard cell library.

11. A non-transitory computer readable medium including processor-executable program instructions comprising instructions for:
    determining a first canonical set of boundary region structures associated with a first boundary region of standard cells in a standard cell library;
    determining a second canonical set of boundary region structures associated with a second boundary region of the standard cells, wherein the first boundary region and second boundary region comprise adjoining regions of adjacently located standards cells;
    performing proximity analysis on boundary region combinations comprising a boundary region structure from the first canonical set and a boundary region structure from the second canonical set;
    responsive to the proximity analysis raising an exception for a specific boundary region combination, identifying standard cell pairs associated with the specific boundary region combination; and
    remediating the standard cell pairs to prevent any standard cell pair from raising the exception.

12. The computer readable medium of claim 11, wherein remediating the standard cell pairs includes modifying a layout of the first boundary region of a first standard cell in the standard cell pair.

13. The computer readable medium of claim 11, wherein remediating the standard cell pairs includes annotating a first standard cell in a first standard cell pair with a placement constraint preventing placement of the first standard cell with its first boundary region adjacent to the second boundary region of the second standard cell.

14. The computer readable medium of claim 11, wherein determining the first canonical set of boundary regions includes:
    merging all first boundary region structures sharing a first layout in common into a first common boundary region structure.

15. The computer readable medium of claim 11, wherein the proximity analysis includes analyzing boundary region combinations for photolithography hotspots, lithography induced timing variability, and colorability for double-patterning photolithography.

16. A data processing system, comprising:
  a processor; and
  a storage medium including processor-executable program instructions for evaluating placement context sensitivity, the program instructions, when executed by the processor, causing the processor to perform operations comprising:
    determining, from a standard cell library including a plurality of standard cells, each indicative of a layout of a plurality of standard cell physical elements, a first boundary library including a first boundary structure corresponding to each of the plurality of standard cells, wherein the first boundary structure indicates a layout of a first boundary region of the corresponding standard cell;
    responsive to identifying multiple first boundary structures in the first boundary library sharing a common layout, merging the multiple first boundary structures into a common boundary structure to produce a reduced first boundary library;
    checking local placement context for the standard cell library by checking local placement context for boundary structure pairs comprising a first boundary structure from the reduced first boundary library and a second boundary structure from a second boundary library corresponding to a second boundary region of the standard cells; and
    responsive to an exception raised by the checking of local placement context of a first boundary structure pair:
      identifying standard cell pairs, including a first standard cell and a second standard cell, that have the first boundary structure pair; and
      resolving the exception by performing an operation selected from:
        annotating the standard cell pairs that have the first boundary structure pair to constrain a subsequent standard cell placement resulting in a standard cell pair possessing the first boundary structure pair; and
        remediating the first boundary structure pair, wherein the remediating includes:
          generating a remediated first boundary structure pair including a remediated first boundary structure; and
          replacing instances of the first boundary structure in the first standard cell of standard cell pairs possessing the first boundary structure with the remediated first boundary structure.

17. The system of claim 16, wherein a layout of the remediated first boundary structure differs from a layout of the first boundary structure and wherein a function of the remediated first boundary structure matches a function of the first boundary structure.

18. The system of claim 16, wherein the operations include:
  determining a number of edge regions upon which to perform the checking of local placement context; and
  determining, a size of each of the edge regions.

19. The system of claim 16, wherein the operations include:
  determining, from the standard cell library, a second boundary library corresponding to the second boundary region of each of the standard cells; and
  responsive to identifying matching second boundary structures in the second boundary library, merging the matching second boundary structures into a common second boundary structure to produce a reduced second boundary library;
  wherein the placement constraints prevent placement of the standard cells identified adjacent to one another as in the specific boundary region combination.

20. The system of claim 16, wherein performing proximity analysis includes analyzing boundary region combinations for photolithography hotspots, photolithography induced timing variability, and colorability for double-patterning photolithography.

* * * * *